United States Patent [19]

Okabe

[11] Patent Number: 4,810,900
[45] Date of Patent: Mar. 7, 1989

[54] ECL CIRCUIT WITH IMPROVED α-RAY RESISTANT PROPERTIES

[75] Inventor: Masatomi Okabe, Hyogo, Japan
[73] Assignee: Mitsubishi Denki K.K., Tokyo, Japan
[21] Appl. No.: 40,252
[22] Filed: Apr. 20, 1987

[30] Foreign Application Priority Data

Jul. 31, 1986 [JP] Japan ................. 61-180596

[51] Int. Cl.$^4$ ................. H03K 19/086; H03K 3/00
[52] U.S. Cl. ................. 307/278; 307/455; 307/308; 307/443
[58] Field of Search ............... 307/455, 278, 309, 491, 307/542, 289, 200 A, 308, 443

[56] References Cited

U.S. PATENT DOCUMENTS

| 4,540,900 | 9/1985 | Early ................. | 307/289 |
| 4,580,066 | 4/1986 | Berndt ................ | 307/455 |
| 4,755,693 | 7/1988 | Suzuki et al. ......... | 307/308 |

FOREIGN PATENT DOCUMENTS 60-143019 7/1985 Japan .
60-169216 9/1985 Japan .

OTHER PUBLICATIONS

Lee et al., "A 2500 Gate Bipolar Macro Cell Array with 250ps Delay" IEEE International SSC Conference, Feb. 1982, pp. 178-179.
Eardley, "Latch Circuit Insensitive to Alpha", IBM-Tech. Disclosure Bulletin, vol. 24, No. 12, May 82.

Primary Examiner—Stanley D. Miller
Assistant Examiner—Timothy P. Callahan
Attorney, Agent, or Firm—Takeuchi Patent Office

[57] ABSTRACT

A semiconductor integrated circuit device with an ECL sequential circuit is disclosed, which comprises a data holding circuit provided the ECL sequential circuit for holding the output thereof, and an emitter follower for feeding the output of the data holding circuit as an input thereof, and an emitter follower circuit control circuit thereto. The emitter follower current when the emitter potential on the emitter follower is at a high level, is set to be lower than the emitter follower current when the emitter potential is at a low level.

6 Claims, 4 Drawing Sheets

ECL CIRCUIT WITH IMPROVED α-RAY RESISTANT PROPERTIES

BACKGROUND OF THE INVENTION

1. Field of the Invention

This invention relates to a semiconductor integrated circuit device and, more particularly, to a bipolar (ECL) integrated circuit having an improved α-ray-resistant property.

2. Description of the Prior Art

FIG. 2. is a circuit diagram showing a D latch circuit published in IEEE ISSCC, Digest of Technical Papers, p 178–179, February 1982. Referring to the Figure, designated at 3D is a latch circuit, at D1 and D2 data inputs, C1 and C2 clock inputs, at R a reset input, at Y a non-inverted latch output, and $\overline{Y}$ an inverted latch output.

FIG. 3 is a circuit diagram showing a prior art D latch circuit based on an ECL series gate circuit construction shown in the papers noted above. In the Figure, designated at D1 and D2 are data inputs, at C1 and C2 clock inputs, at R a reset input, at Y a non-inverted latch output, and at $\overline{Y}$ an inverted latch output. Designated at Q31 to Q39, Q3a and Q3b NPN transistors, Q3c and Q3d NPN double emitter transistors, and R30 to R39 and R3a resistors.

This circuit has a two-stage series gate structure. Designated at VBB1 and VBB2 are reference voltages, at VBB1 a high potential side reference voltage, at VBB2 a low potential side reference voltage, and at Vcs a reference voltage to the current source transistor Q3b.

Now, the operation will be explained. It is assumed that the reset input R is at a low level because this has no essential relation to the description hereinafter. It is now assumed the two clock inputs C1 and C2 are at a low level. At this time, the transistor Q39 is "off" while the transistor Q3a is "on". Thus, the OR logic of the data inputs, i.e., D1+D2, appears at the output Y, while the output $\overline{Y}$ is $\overline{D1+D2}$. For example, when both the inputs D1 and D2 are at low level, the output Y is at a low level while the output $\overline{Y}$ is at a high level.

When at least one of the clock inputs C1 and C2 goes to a high level, the transistor Q39 which has been "off" is turned on while the transistor Q3a which has been "on" is turned off. As a result, the switching current Is flows from through the current source transistor Q3b to through the transistor Q39. Since the output Y is at low level, the potential at the node N31 is also at low level. Also, since the output $\overline{Y}$ is at high level, the potential at the node N32 is at high level.

From the above, it is apparent that the switching current Is flows through the transistors Q39 and Q37. Also, due to the voltage drops across the resistors R30 and R32, the potential at the node N31 is at low level. Thus, the output Y is held at low level, and the output $\overline{Y}$ at high level. Thus, even when one of the data inputs D1 and D2 is changed to high level, the switching current Is never flows through the transistors Q31 and Q32. Thus, the output is held unchanged. That is, the output is held latched. In other words, the above circuit constitutes a latch circuit.

Recently, semiconductor elements have been made fine to such an extent that soft errors due to α-particles generated from packages or the like can not be ignored. Soft errors will now be described with reference to FIG. 3.

Now assume that the output Y is held at high level and the output $\overline{Y}$ at a low level (i.e., at least one of the clock inputs C1 and C2 is at high level). At this time, the transistor Q38 is "on", and the transistors Q36 and Q37 are "off". Thus, the nodes N30 and N32 are at low level, and the nodes N31 and N33 are at high level.

In this state, when one of the transistors Q33, Q36 and Q37 connected to the node N31 is irradiated with α-rays, electron-hole pairs are generated. When the electrons are collected in the collector area, the collector potential, i.e., the potential on the node N31 is momentarily reduced. To make up for this reduction, charging is done from the power source Vcc through the resistors R30 and R32. Therefore, even if the pulse width is minimum, a spike-like pulse of several hundred picoseconds is generated. This pulse is transmitted as noise to the node N33 and fed back to the base of the transistor Q38. Therefore, the transistor Q38 which has been "on" is cut off, while the transistor Q37 is turned on. The contents of the data that has been held are thus inverted.

The spike noise that is generated by such α-rays is substantially inversely proportional to the capacitance accompanying the collector of the transistor. For this reason, future soft errors due to semiconductor element size reduction are inevitable.

The prior art ECL sequential circuit has a problem of inversion of the held data due to α-rays. To solve this problem it has been proposed to add capacitance to the transistor of the data holding circuit (as disclosed in Japanese Patent Kokai No. 60-142619) or increase current (as disclosed in Japanese Patent Kokai No. 60-143019). In these methods, however, there is a delay time in the sequential circuit or increase of power consumption.

SUMMARY OF THE INVENTION

A primary object of the invention is to provide a semiconductor integrated circuit device, which can solve the problem of soft errors due to α-rays or the like without increasing the power consumption and delay time.

The above objects, features and advantages of the invention will become more apparent from the following description with reference to the accompanying drawings.

BRIEF DESCRIPTION OF THE DRAWINGS

FIG. 4 is a waveform chart showing waveforms produced according to the prior art and the invention, respectively, in which FIG. 4(a) shows a waveform at a data holding node when it is irradiated with α-rays; and FIGS. 4(b) and 4(c) show waveforms of the output of an emitter follower connected to a data holding node according to the prior art and the invention respectively.

DESCRIPTION OF THE PREFERRED EMBODIMENTS

Referring to the Figures, designated at Q17 is a hold side flip-flop gate or bias transistor, Q18 an input side flip-flop, gate or feedback transistor, Q1c, Q1d emitter follower transistors, 10 a flip-flop circuit (data holding circuit), and 20 an emitter follower current control circuit.

Figure 1:
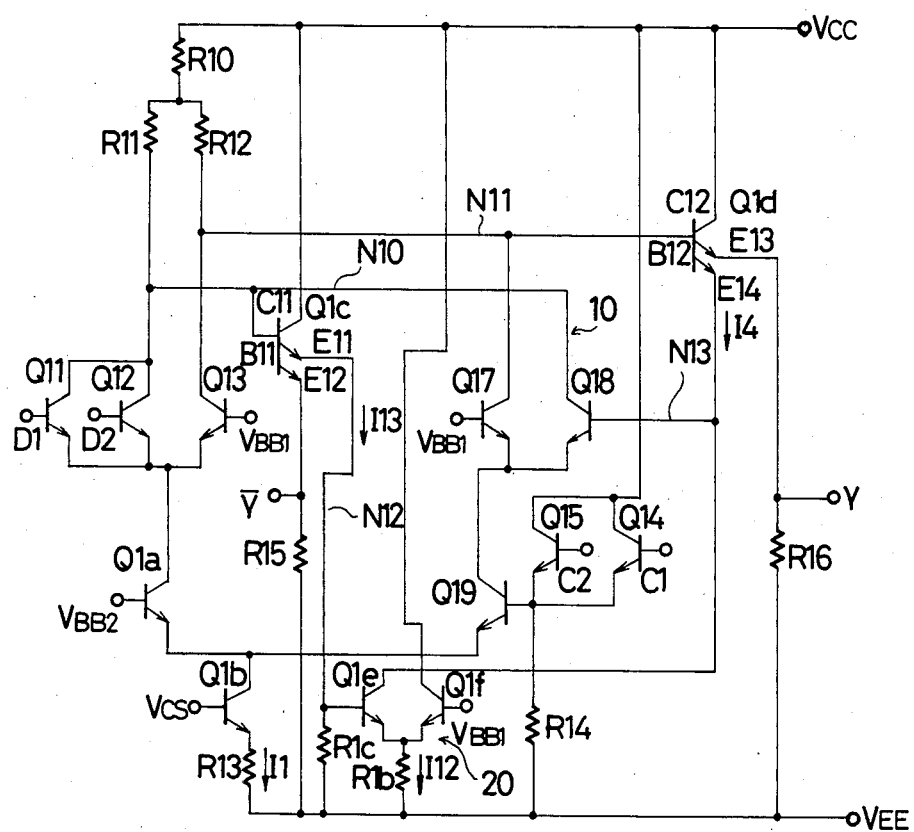
FIG. 1 is a circuit diagram showing a D latch circuit for a semiconductor integrated circuit device according to an embodiment of the invention.
Figure 2:
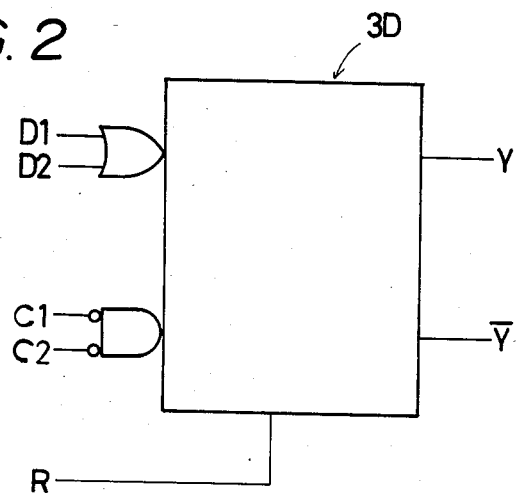
FIG. 2 is a view showing a prior art D latch circuit.

FIG. 1 shows a semiconductor integrated circuit device according to an embodiment of the invention. Designated at D1 and D2 are data inputs, C1 and C2 clock inputs, Y a non-inverted latch output, and $\overline{Y}$ an inverted latch output. The reset inputs are not described because they are irrelevant to the subject matter of the invention. Designated at Q11 to Q15, Q17 to Q19, Q1a and Q1b are NPN transistors, Q1c and Q1d double emitter transistors for an emitter follower, which may be the same as the elements constituting the prior art D latch circuit shown in FIG. 3. Q1e and Q1f NPN transistors which are provided in accordance with the invention, R10 and R1c resistors, and Vcc and VEE power sources.

Figure 3:
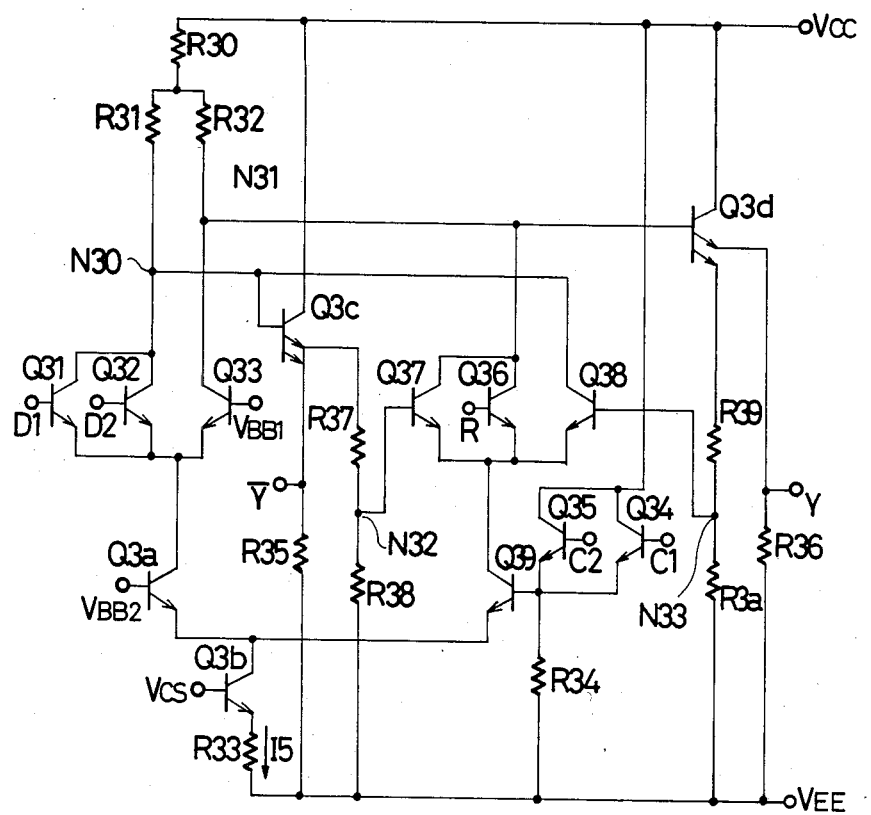
FIG. 3 is a circuit diagram showing a specific construction of the prior art D latch circuit.

The circuit of the embodiment has a two-stage series data construction like the prior art D latch circuit shown in FIG. 3. Designated at VBB1 and VBB2 are two reference voltages with the voltage VBB1 on the high potential side and the voltage VBB2 on the low potential side, and Vcs a reference voltage to the current source transistor Q1b.

The flip-flop circuit 10 which holds data is biased by the voltage VBB1. It consists of a bias transistor Q17 constituting a hold side flip-flop gate and a feedback transistor Q18, in which the potential on at the collector node N11 of the transistor Q17 is supplied to the base of the transistor Q18 after its level is shifted by the emitter follower transistor Q1d.

The emitter follower current control circuit 20 consists of the transistors Q1e and Q1f and resistor R1b according to the invention. The node N12 is connected to the base of the transistor Q1e, while the high reference voltage VBB1 is supplied to the base of the transistor Q1f, and the collector of the transistor Q1f is connected to the power source Vcc.

Now, the operation will be described. It is now assumed that both the clock inputs C1 and C2 are at low level. At this time, the transistor Q19 is turned off, and the transistor Q1a is turned on. Thus, the OR logic of the data inputs, i.e., D1+D2, appears at the output Y, and the NOR logic of the data inputs, i.e., $\overline{D1+D2}$, appears at the output $\overline{Y}$. Where the data inputs D1 and D2 are respectively at high and low levels the node N10 is at low level, and the node N11 is at high level. Thus the output Y is at high level, and the output $\overline{Y}$ is at low level.

When at least one of the clock inputs C1 and C2 is at a high level, the transistor 19 which has been "off" is turned on, and the transistor Q1a which has been "on" is turned off. Consequently, a constant current I1 flows to the current source transistor Q1b through the transistor Q19. Thus, the flip-flop circuit 10 holds a piece of data. Now, the output Y is at high level, so that the transistor Q18 and Q17 are respectively "on" and "off". The switching current thus flows through the transistor Q18. The potentials at the nodes N10 and N11 are respectively at low and high levels due to the voltage drops across the resistors R10 and R11, so that both the outputs Y and $\overline{Y}$ are held. When either one of the data inputs D1 and D2 is changed subsequently to high level, the switching current never flows through the transistors Q11 and Q12, so that the outputs are held unchanged. In other words, they remain latched.

Now, the operation of the emitter follower current control circuit 20 consisting of the transistors Q1e and Q1f and resistor R1b provided according to the invention will be described. When the potentials at the nodes N10 and N11 are respectively at low and high levels, that is, when the outputs $\overline{Y}$ and Y are respectively at low and high levels, the transistors Q1e and Q1f are respectively "off" and "on". Thus, the switching current I2 flows from the power source Vcc through the transistor Q1f, but it does not flow from the emitter E14 of the transistor Q1d. In other words, the impedance of the circuit viewed from the emitter E14 to the transistor Q1a is infinite. The emitter follower current I4 flowing from the emitter E14 is the sole base drive current for the transistor Q18. Therefore, the current value is expressed substatially as $\alpha^2 I1/\beta$. Here, $\alpha$ is a DC collector-emitter current gain, and $\beta$ is the collector-base current gain.

Usually, $\beta \neq 100$. When $\beta$ is set at $\beta \neq 100$, $I14 \neq 0.0098 I1$. When the switching current I1 is 1 mA, the emitter follower current I4 is about 9.8 $\mu$A, which is as small as 1/10 to 1/100 of the ordinary emitter follower current which is of the order of several hundred $\mu$A to several mA. Thus, a transistor consisting of B12-C12-E14 of the transistor Q1d is very close to the "off" state.

Meanwhile, a transistor which consists of the base B12 and emitter E13 of the transistor Q1d thus is held in the ordinary "on" state, so that an emitter follower current is determined by the resistor R16.

Now, suppose that the latch circuit is irradiated with $\alpha$-rays, and the node N11 is at high level. When the transistor Q13 or Q17 connected to the node N11 is irradiated with $\alpha$-rays, electron-hole pairs are generated in the silicon. The generated electrons drift and diffuse at a time constant of several ten to several hundred ps. When electrons are collected in a collector area, the potential of the node N11 is momentarily reduced. When this reduction occurs, the oridinal high level state is restored by charging from the power source Vcc through the resistors R10 and R12. Through this charging, a spike noise of the order of several hundred ps is generated even when a pulse width is minimum. The noise is transmitted to the output Y through the emitter follower transistor Q1d.

Meanwhile, a feedback through the node N11 to the base of the feedback transistor Q18 constituting an input side flip-flop gate is made through a transistor consisting of B12-C12-E14 of the emitter follower transistor Q1d. At this time, the switching current I4 is as low as 9.8 $\mu$A as noted above, and when the potential of the node N11 is momentarily reduced, the transistor B12-C12-E14 is readily turned off with the approach of the base-emitter voltage to 0 V or negative value. For this reason, the output impedance of the transistor consisting of B12-C12-E14 has an extremely large value. Further, the input impedance looked from the base of the transistor Q18 has a large value when the potential of the node N13 is at high level. Therefore, the response output of the emitter follower transistor B12-C12-E14 decreases with a very large time constat compared to the normal value.

Figure 4:
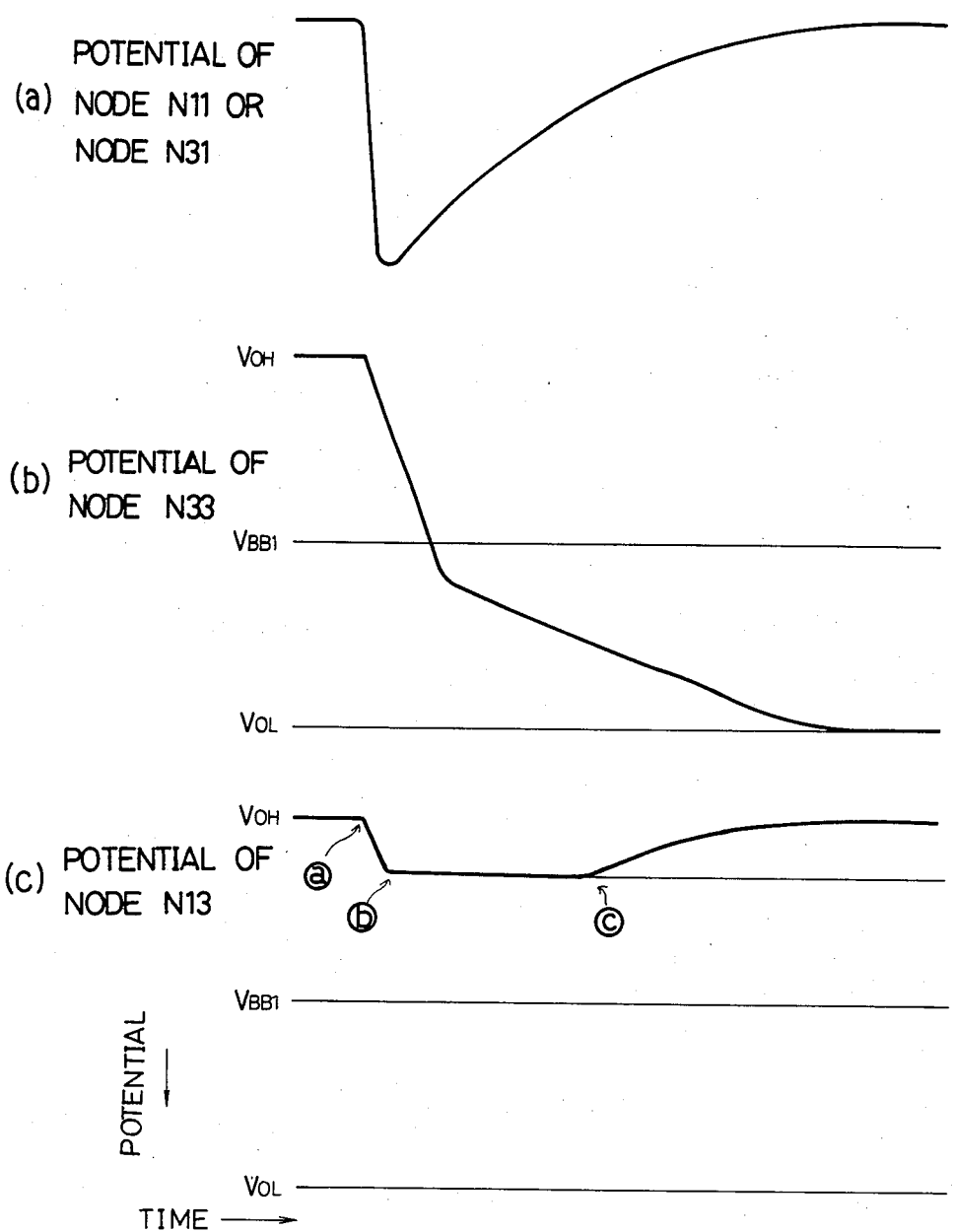

What has been described above is shown in FIG. 4 in comparison with the prior art. In the prior art case, the potential of the feedback input node N33 which has been at high level is reduced below the reference voltage VBB1, and it is inverted at low level when the transistor Q38 is turned off (see FIGS. 4(a) and 4(b)). In the case of this embodiment, even with appearance of a spike noise at the node N11 the potential of the feedback input N13 which is at high level does not become lower than the reference voltage VBB1 due to the cut-off of the emitter follower transistor consisting of B12-C12-E14, so that the data is held (see FIGS. 4(a) and 4(c)). During the period from the instant ⓐ till the instant ⓑ in FIG. 4(c) the emitter follower transistor is not perfectly turned off, and the output impedance is comparatively low. At the instant ⓑ the transistor is substantially turned off. During a period from the instant ⓑ till the instant ⓒ, the level falls with an extremely large time constant. At the instant ⓒ, the potential at the node N11, i.e., the base potential B12, is alredy rising, and the path between the base B12 and emitter E14 is forwardly biased again, so that the initial high level commences to be restored. Therefore, even where the spike noise due to α-rays increases with reduction of the size of the semiconductor elements, no error will result due to the alpha-rays strike.

Although the above description the potential at the node N11 is held at the high level, since the base of the bias transistor Q17 constituting a hold side flip-flop gate is biased by VBB1, there is no adverse effects of spike noise due to α-rays when the potential at the node N10 is at the high level.

As has been described in the foregoing, the emitter follower response is extremely retarded with respect to the spike noise due to α-rays, but the response of the emitter follower in case of operation as a sequential circuit is not retarded at all compared to the response to the ordinary emitter follower. This is so because in case of the invention of the output Y, i.e., the potential at the node N13, from the high level to the low level, opposite to the case of the spike noise application, the output $\overline{Y}$ and potential on the node N12 are inverted from the low level to the high level, so that the transistor Q1e is turned on, to conduct current from the node N13.

Figure 5:
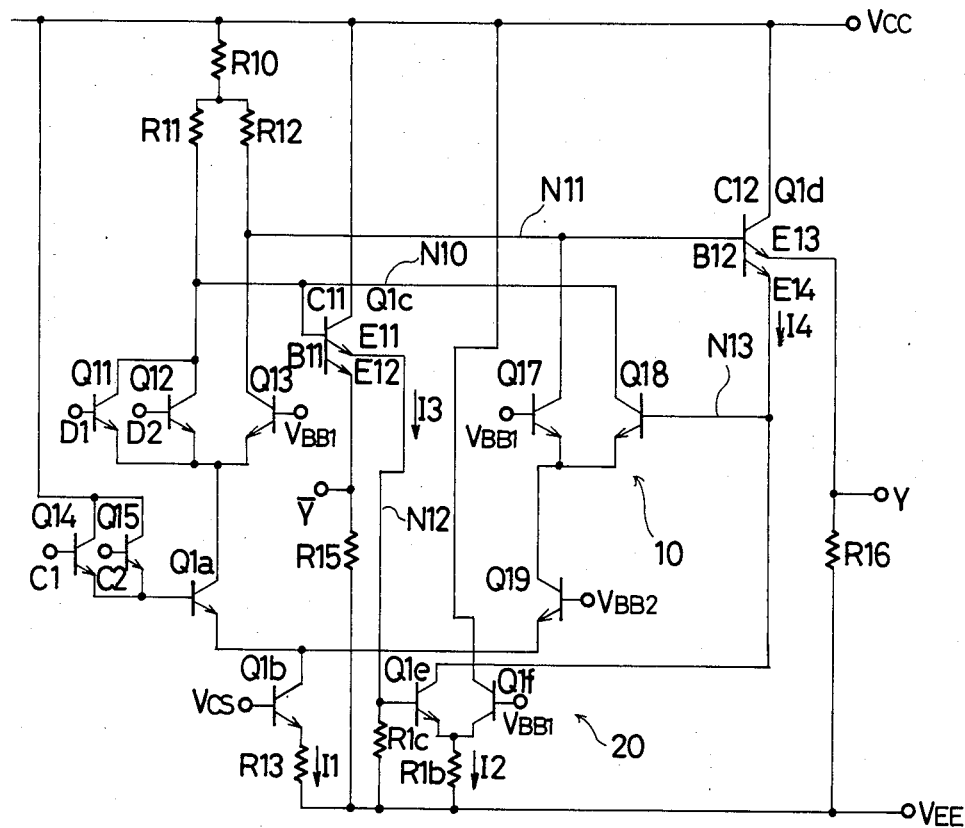
FIG. 5 is a circuit diagram showing a D latch circuit according to another embodiment of the invention.

The above embodiments has concerned with the latch circuit which holds data when the clock inputs are at the high level. However, the same effects can be obtained when the invention is applied to a latch circuit which holds data when the clock inputs are at the low level as shown in FIG. 5.

Further, while the above embodiments have concerned with the D latch circuit only, the same effects can also be obtained with other sequential circuits so long as a flip-flop circuit is involved, to which signals are fed back through an emitter follower.

As has been described in the foregoing, with the semiconductor integrated circuit according to the invention, even when a spike noise due to α-rays is generated at a node of a flip-flop circuit, the potential of which is held at a high level, and the emitter follower is turned off. Thus, it is possible to prevent transmission of the spike noise to the bias transistor and greatly improve the freedom from soft errors due to α-rays without increasing power consumption or delay time.

What is claimed is:

1. A semiconductor integrated circuit device with an ECL sequential circuit comprising:
    a series gated latch circuit provided in said ECL sequential circuit for holding a binary data signal thereof;
    an emitter follower circuit including a pair of first and second transistors, said first emitter follower transistor having its base connected to an output of said latch circuit and its emitter connected to an input of said latch circuit for feeding said binary data signal of said latch circuit back to said input of said latch circuit; and
    an emitter follower current control circuit having its input connected to an emitter of said second emitter follower transistor and its output connected to said emitter of said first emitter follower transistor to control an amount of emitter follower current to be lower when an emitter potential of said first emitter follower transistor is at a high level than when said emitter potential is at a low level.

2. The semiconductor integrated circuit device according to claim 1, wherein a feedback portion of said latch circuit is a single-ended feedback circuit consisting of a bias transistor and a feedback transistor.

3. The semiconductor integrated circuit device according to claim 2, wherein a reference voltage is supplied to a base of said bias transistor and a collector potential of said bias transistor is fed back through said first emitter follower transistor to a base of said feedback transistor.

4. The semiconductor integrated circuit device according to claim 3, wherein said first emitter follower transistor is substantially cut off by said emitter follower current control circuit, which is coupled to both said base of said feedback transistor and said emitter of said first emitter follower transistor, when said emitter potential of said first emitter follower transistor is at a high level.

5. The semiconductor integrated circuit device according to claim 1, wherein said emitter follower current control circuit comprises an emitter coupled transistor pair consisting of a second bias transistor and a control transistor, with their emitters coupled to a negative-most power supply through a common resistor.

6. The semiconductor integrated circuit device according to claim 5, wherein a base and a collector of said second bias transistor are coupled to said reference terminal and a positive-most power supply, respectively, and a base and a collector of said control transistor are coupled to a collector of said feedback transistor through said second emitter follower transistor and both said base of said feedback transistor and said emitter of said first emitter follower transistor, respectively.

* * * * *